United States Patent
Kang

(10) Patent No.: US 8,008,685 B2
(45) Date of Patent: Aug. 30, 2011

(54) LIGHT EMITTING DEVICE, METHOD OF MANUFACTURING LIGHT EMITTING DEVICE, LIGHT EMITTING DEVICE PACKAGE, AND LIGHTING SYSTEM

(75) Inventor: Dae Sung Kang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/986,903

(22) Filed: Jan. 7, 2011

(65) Prior Publication Data
US 2011/0169043 A1    Jul. 14, 2011

(30) Foreign Application Priority Data
Jan. 11, 2010 (KR) .................. 10-2010-0002434

(51) Int. Cl.
*H01L 33/00* (2010.01)
(52) U.S. Cl. ............. 257/99; 257/13; 257/94; 438/26; 438/39; 438/47
(58) Field of Classification Search ............ 257/13, 257/94, 99; 438/26, 39, 47
See application file for complete search history.

(56) References Cited

U.S. PATENT DOCUMENTS
2008/0283846 A1   11/2008   Ohmae et al.
2009/0065762 A1   3/2009    Lee et al.
2009/0101925 A1   4/2009    Shakuda
2010/0059759 A1   3/2010    Akita et al.
2010/0187565 A1*  7/2010    Kamei et al. .............. 257/103

FOREIGN PATENT DOCUMENTS
| JP | 5-190896 A | 7/1993 |
| JP | 09-235197 A | 9/1997 |
| JP | 2007-234908 A | 9/2007 |
| KR | 10-2009-0001107 A | 1/2009 |
| KR | 10-2009-0012241 A | 2/2009 |

* cited by examiner

*Primary Examiner* — Julio J Maldonado
(74) *Attorney, Agent, or Firm* — Birch, Stewart, Kolasch & Birch, LLP

(57) ABSTRACT

Provided are a light emitting device, a method of manufacturing the light emitting device, a light emitting device package, and a lighting system. The light emitting device comprises a light emitting structure layer including a first conductive type semiconductor layer, a second conductive type semiconductor layer, an active layer between the first conductive type semiconductor layer and the second conductive type layer. At least one lateral surface of the light emitting structure layer has cleavage planes of an A-plane and an M-plane.

7 Claims, 9 Drawing Sheets

M Plane (1$\bar{1}$00)

A Plane (11$\bar{2}$0)

m-direction a-direction

LIGHT EMITTING DEVICE, METHOD OF MANUFACTURING LIGHT EMITTING DEVICE, LIGHT EMITTING DEVICE PACKAGE, AND LIGHTING SYSTEM

CROSS-REFERENCE TO RELATED APPLICATIONS

The present application claims priority of Korean Patent Application No. 10-2010-0002434 filed on Jan. 11, 2010, which is hereby incorporated by reference in its entirety.

BACKGROUND

The present disclosure relates to a light emitting device, a method of manufacturing the light emitting device, a light emitting device package, and a lighting system.

Light emitting diodes (LEDs) are being used as light emitting devices.

Such an LED is a semiconductor light emitting device that converts current into light.

A wavelength of light emitted from the LED is varied according to a semiconductor material used for manufacturing the LED. This is done because a wavelength of the emitted light depends on a band-gap of semiconductor material. The respective band-gaps represent an energy difference between a valence band electrons and conduction band electrons.

As luminance of LEDs is increased, the LEDs are being used as light sources for displays, vehicles, and illuminations. Also, LEDs emitting highly efficient white light may be realized by using a fluorescent substance or combining LEDs having various colors.

SUMMARY

Embodiments provide a light emitting device having a new structure, a method of manufacturing the light emitting device, a light emitting device package, and a lighting system.

Embodiments also provide a light emitting device having improved light extraction efficiency, a method of manufacturing the light emitting device, a light emitting device package, and a lighting system.

In one embodiment, a light emitting device comprising a light emitting structure layer including: a first conductive type semiconductor layer; an active layer on the first conductive type semiconductor layer; and a second conductive type semiconductor layer on the active layer, wherein all the sides of the first conductive type semiconductor layer and the second conductive type semiconductor layer of the light emitting structure layer alternately comprise cleaved facets of A-plane and M-plane.

In another embodiment, a light emitting device package comprising: a package body; a first electrode and a second electrode electrically separated from each other on the package body; a light emitting device electrically connected with the first electrode and the second electrode on the package body; and a molding member surrounding the light emitting device on the package body, wherein the light emitting device comprises a light emitting structure layer having a first conductive type semiconductor layer, an active layer on the first conductive type semiconductor layer, and a second conductive type semiconductor layer on the active layer, and wherein all the sides of the first conductive type semiconductor layer and the second conductive type semiconductor layer of the light emitting structure layer alternately comprise cleaved facets of A-plane and M-plane.

In further another embodiment, a lighting system comprises: a substrate; and a light emitting module comprising a light emitting device on the substrate, wherein the light emitting device comprises a light emitting structure layer including a first conductive type semiconductor layer, a second conductive type semiconductor layer, and an active layer between the first conductive type semiconductor layer and the second conductive type semiconductor layer, and at least one lateral surface of the light emitting structure layer has cleavage planes of an A-plane and an M-plane.

In still further another embodiment, a method of manufacturing a light emitting device comprises: forming a light emitting structure layer comprising a first conductive type semiconductor layer, an active layer, and a second conductive type semiconductor layer on a C-plane sapphire substrate; and scribing the C-plane sapphire substrate and the light emitting structure layer into a chip unit to form cleavage planes of an A-plane and an M-plane on at least one lateral surface of the light emitting structure layer.

The details of one or more embodiments are set forth in the accompanying drawings and the description below. Other features will be apparent from the description and drawings, and from the claims.

DETAILED DESCRIPTION OF THE EMBODIMENTS

Figure 1:
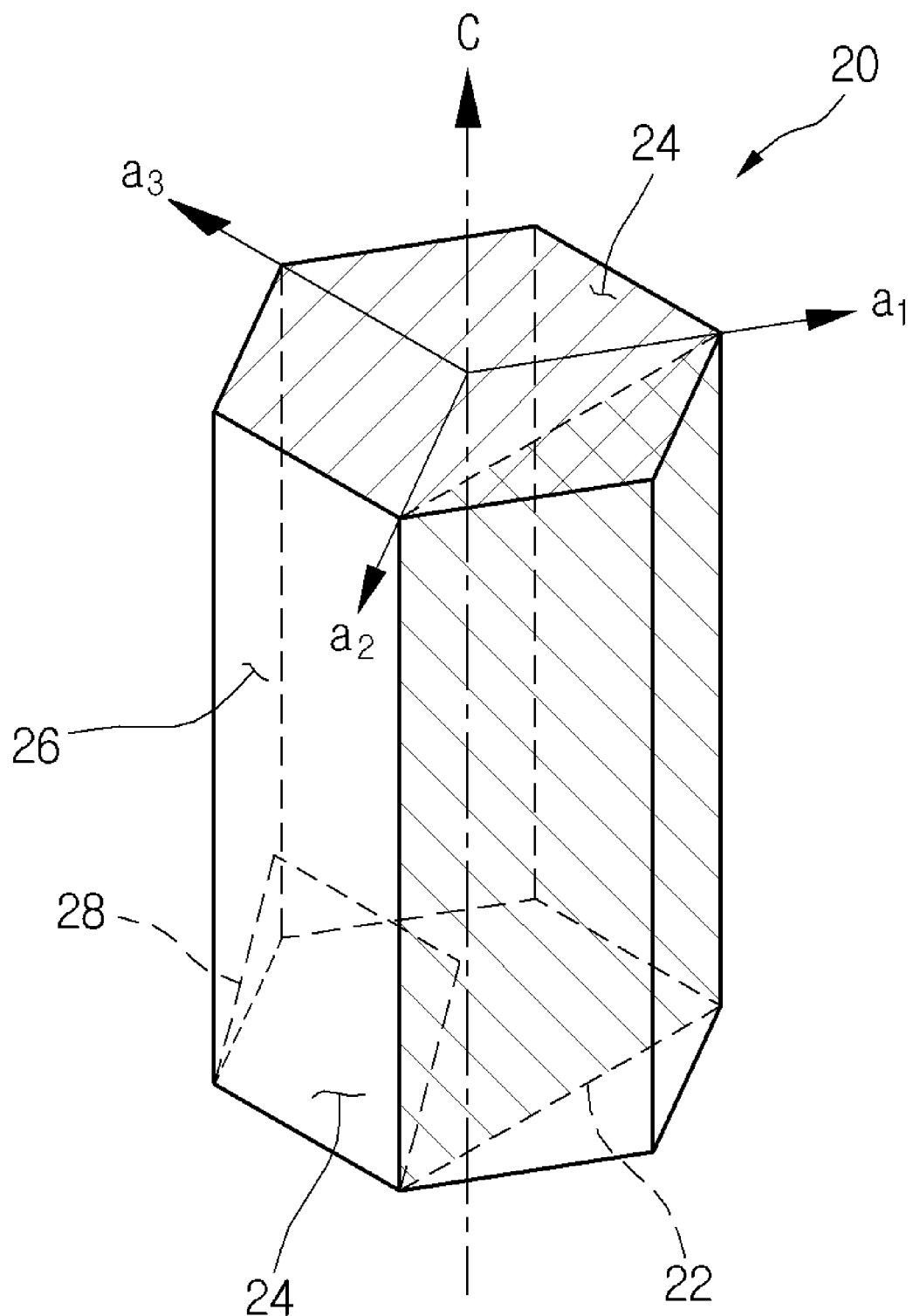
FIG. 1 is a view illustrating a crystal structure of sapphire.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device, a method of manufacturing the light emitting device, a light emitting device package, and a lighting system will be described in detail with reference to the accompanying drawings.

FIG. 1 is a view illustrating a crystal structure of sapphire.

A sapphire unit cell 20 has a hexagonal crystal structure. FIG. 1 illustrates positions and directions of an A-plane 22, C-planes 24, an M-plane 26, and an R-plane 28 of the sapphire unit cell 20. The A-plane 22 is perpendicular to the C-planes, and the M-plane 26 defines a lateral surface of the sapphire unit cell 20. The R-plane 28 is inclined at an angle of about 57.6 degrees with respect to the C-planes 24. The sapphire unit cell 20 has axes a1, a2, and a3, which cross each other at an angle of about 120 degrees on the same plane and an axis C perpendicular to the plane.

Figure 2:
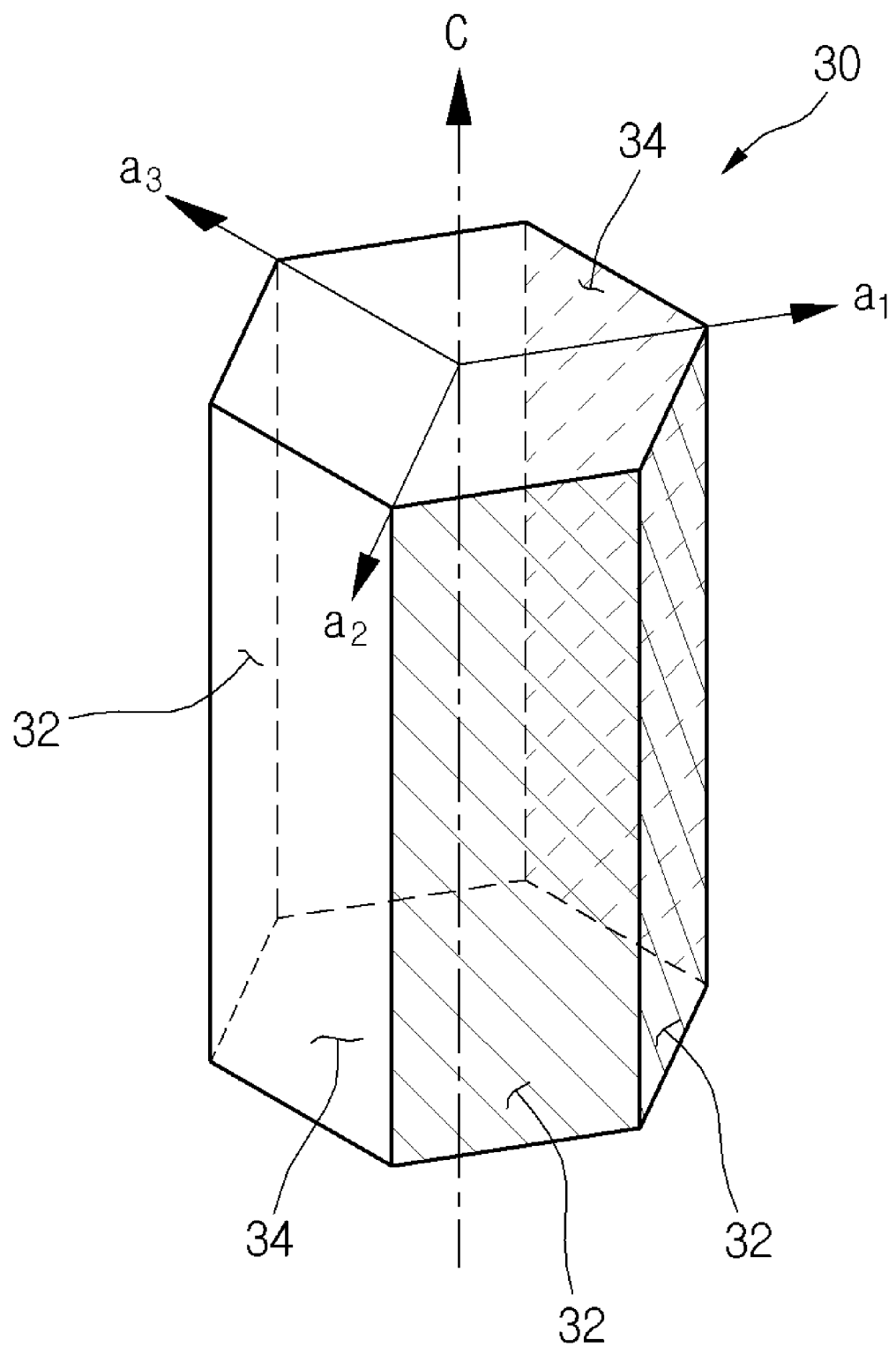
FIG. 2 is a view illustrating a unit cell of GaN that is a Group III-V nitride compound semiconductor.

FIG. 2 is a view illustrating a unit cell of GaN that is a Group III-V nitride compound semiconductor.

A GaN unit cell 30 has a hexagonal crystal structure. The GaN unit cell 30 has M-planes 32 defining lateral surfaces and C-planes 34 defining C-surfaces of a top surface and a bottom surface.

When GaN is grown on the C-planes 24 of a sapphire, a grid layout of the GaN is offset from a grid layout of the sapphire by about 30 degrees. That is, in case where the sapphire on which the GaN is grown is cut along an axis C, when an A-plane 22 of the sapphire is exposed to a lateral surface, an M-plate 32 of the GaN grown on the sapphire is exposed.

Figure 3:
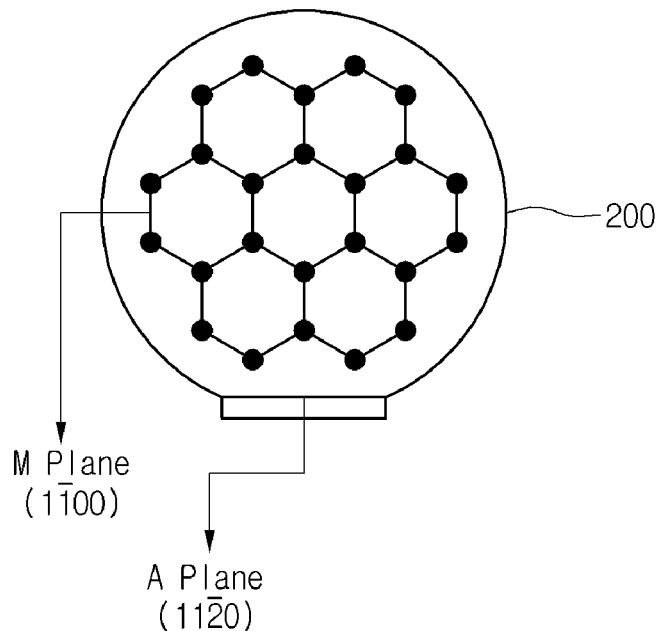
FIG. 3 is a view illustrating an atomic arrangement of a C-plane sapphire substrate.
Figure 4:
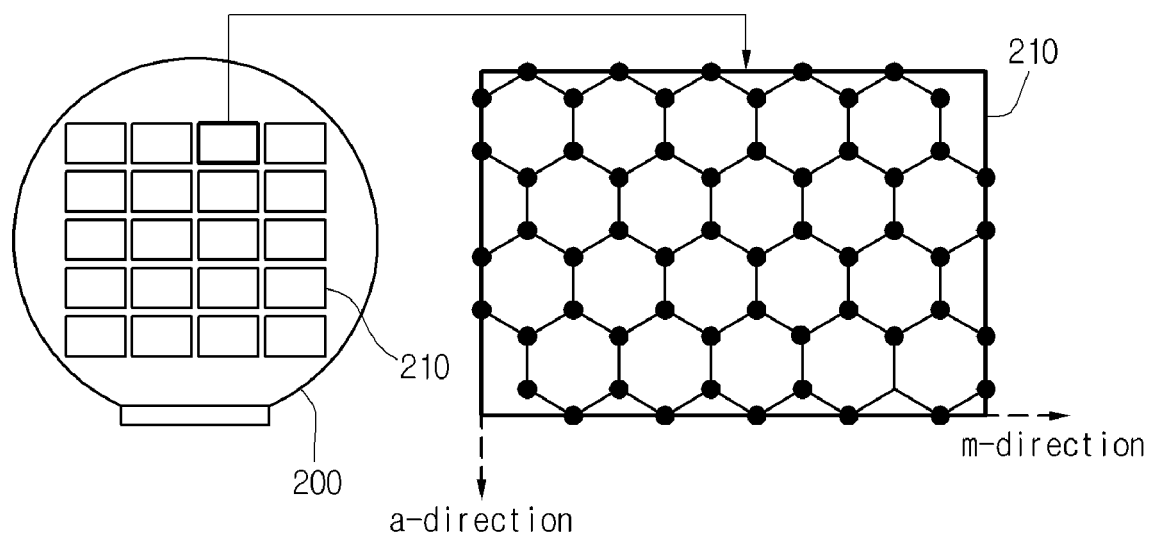
FIG. 4 is a view of a state in which a C-plane sapphire substrate is scribed into chip units.

FIG. 3 is a view illustrating an atomic arrangement of a C-plane sapphire substrate, and FIG. 4 is a view of a state in which a C-plane sapphire substrate is scribed into chip units.

A C-plane sapphire substrate 200 has the same sapphire atomic arrangement as that of FIG. 3, and GaN is grown on the C-plane sapphire substrate 200 to form a light emitting structure layer of a light emitting device.

Referring to FIG. 4, the C-plane sapphire substrate 200 is scribed into a plurality of unit chips 210. As a scribing method, a method using a laser is given as well as a mechanical method using a diamond cutter or the like. For example, a laser stealth scribing may be used for scribing the C-plane sapphire substrate 200

Generally, the C-plane sapphire substrate 200 is scribed in a direction perpendicular and parallel to an A-plane. That is, the C-plane sapphire substrate 200 is scribed in an in-direction perpendicular to an M-plane and an a-direction perpendicular to the A-plane.

Thus, the unit chips 210 of the C-plane sapphire substrate 200 have clean cleavage planes of the A-plane and the M-plane.

Figure 5:
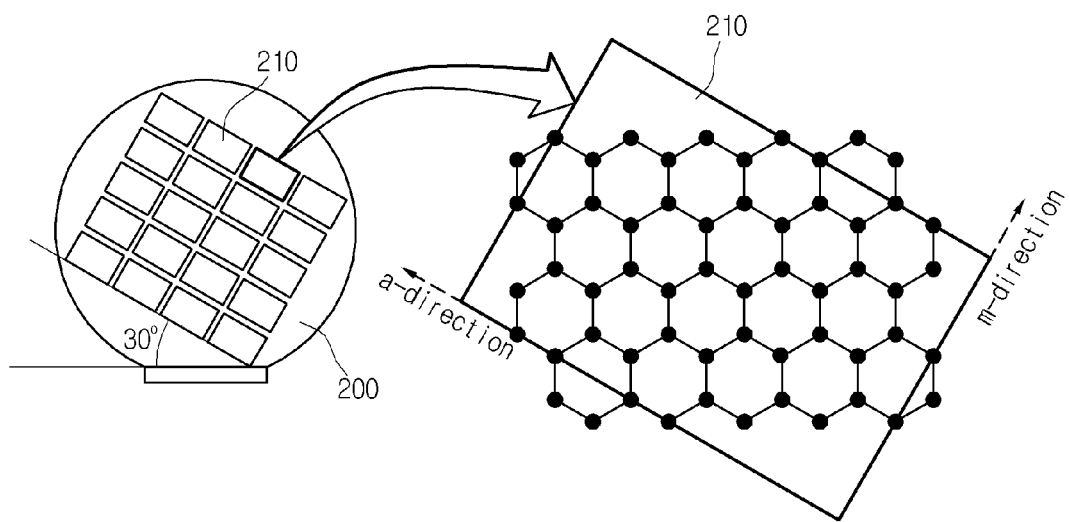
FIGS. 5 and 6 are views of a state in which a C-plane sapphire substrate is scribed at an angle different from that of FIG. 4.
Figure 6:
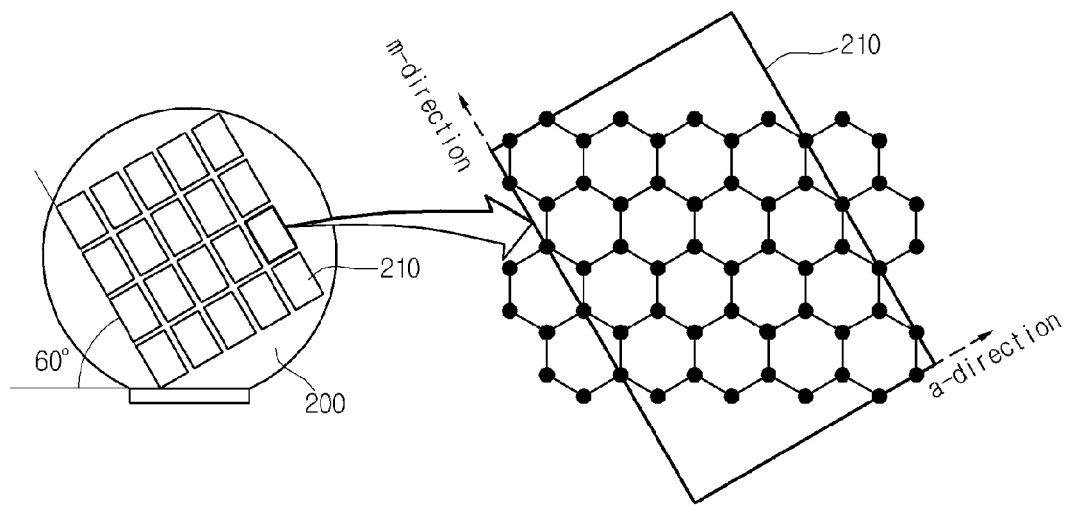

FIGS. 5 and 6 are views of a state in which a C-plane sapphire substrate is scribed at an angle different from that of FIG. 4.

When the C-plane sapphire substrate 200 is scribed at an angle of about 30 degrees with respect to the A-plane as shown in FIG. 5 or the C-plane sapphire substrate 200 is scribed at an angle of about 60 degrees with respect to the A-plane as shown in FIG. 6, the unit chips 210 of the C-plane sapphire substrate 200 have the clean cleavage planes of the A-plane and the M-plane due to a characteristic of the sapphire having the hexagonal crystal structure.

That is, the cleavage planes of the A-plane are formed on two lateral surfaces among four lateral surfaces of the unit chips 210 of the C-plane sapphire substrate 200, the cleavage planes of the M-plane are formed on the other two planes of the four lateral surfaces.

Figure 7:
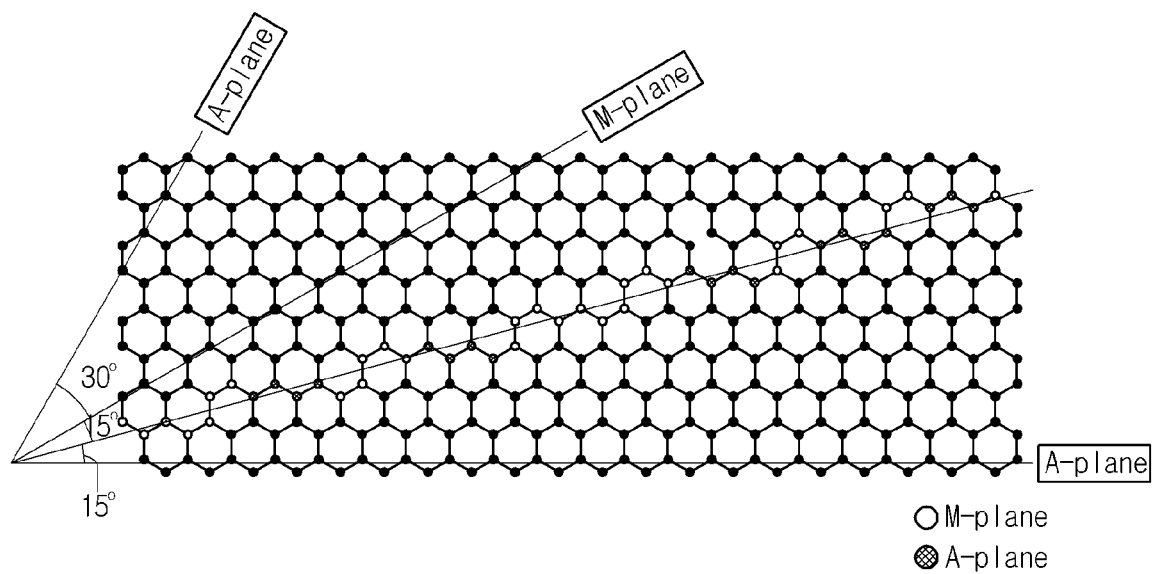
FIG. 7 is a view illustrating a lattice structure of a C-plane sapphire substrate and a cleavage plane of a state in which the C-plane sapphire substrate is scribed at an angle inclined with respect to an A-plane.

FIG. 7 is a view illustrating a lattice structure of a C-plane sapphire substrate and a cleavage plane of a state in which the C-plane sapphire substrate is scribed at an angle inclined with respect to an A-plane.

Referring to FIG. 7, when the C-plane sapphire substrate 200 is scribed at an angle of about 30 degrees with respect to the A-plane, the cleavage planes of the M-plane are formed. Also, when the C-plane sapphire substrate 200 is scribed at an angle of about 60 degrees with respect to the A-plane, the cleavage planes of the A-plane are formed.

However, when the C-plane sapphire substrate 200 is scribed at an angle that is not integer times of about 30 degrees with respect to the A-plane, for example, when the C-plane sapphire substrate 200 is scribed at an angle of about 15 degrees with respect to the A-plane, the cleavage planes of the A-plane and the cleavage planes of the M-plane are alternately formed.

Also, when the C-plane sapphire substrate 200 is scribed at an angle that is not integer times of about 30 degrees with respect to the A-plane, the A-plane and the M-plane are alternately formed on the GaN grown on the C-plane sapphire substrate 200.

Figure 8:
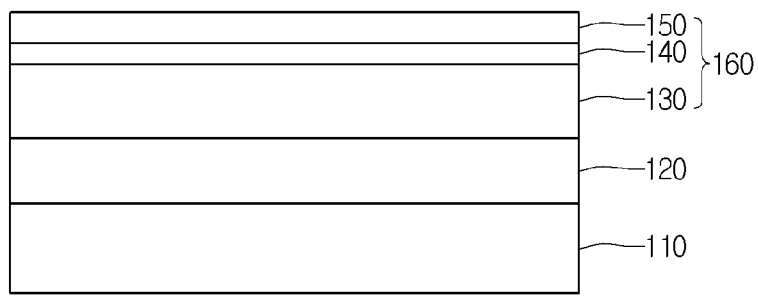
FIG. 8 is a sectional view of a sapphire substrate on which GaN is grown.

FIG. 8 is a sectional view of a sapphire substrate on which GaN is grown.

Referring to FIG. 8, a Group III-V nitride compound semiconductor layer may be grown on a sapphire substrate 110.

The sapphire substrate 110 is a C-plane sapphire substrate. An undoped nitride semiconductor layer 120 is disposed on a C-plane of the sapphire substrate 110. A light emitting structure layer 160 including a first conductive type semiconductor layer 130, an active layer 140, and a second conductive type semiconductor layer 150 is disposed on the undoped nitride semiconductor layer 120.

A buffer layer may be disposed between the sapphire substrate 110 and the undoped nitride semiconductor layer 120.

Also, the first conductive type semiconductor layer 130 may be directly grown on the buffer layer without forming the undoped nitride semiconductor layer 120, or the first conductive type semiconductor layer 130 may be directly grown on the sapphire substrate 110.

The light emitting structure layer 160 may include a GaN-based semiconductor layer. For example, the first conductive type semiconductor layer 130 may include a GaN layer, an InGaN layer, an AlGaN layer, or an InAlGaN layer in which n-type impurities are injected. The second conductive type semiconductor layer 150 may include a GaN layer, an InGaN layer, an AlGaN layer, or an InAlGaN layer in which p-type impurities are injected. The active layer 140 may include a GaN well layer/GaN barrier layer or an InGaN well layer/GaN barrier layer, or a GaN well layer/AlGaN barrier layer.

The light emitting structure layer 160 disposed on the sapphire substrate 110 may be scribed into a chip unit to constitute a laser diode or a light emitting diode.

Here, the sapphire substrate 110 is scribed at an angle that is integer times of about 30 degrees with respect to an A-plane, and four lateral surfaces of the sapphire substrate 110 respectively have cleavage planes in which the A-plane and an M-plane are alternately formed.

Similarly, each of four lateral surfaces of the light emitting structure layer 160 grown on the sapphire substrate 110 has cleavage planes in which the A-plane and the M-plane are alternately formed.

Figure 9:
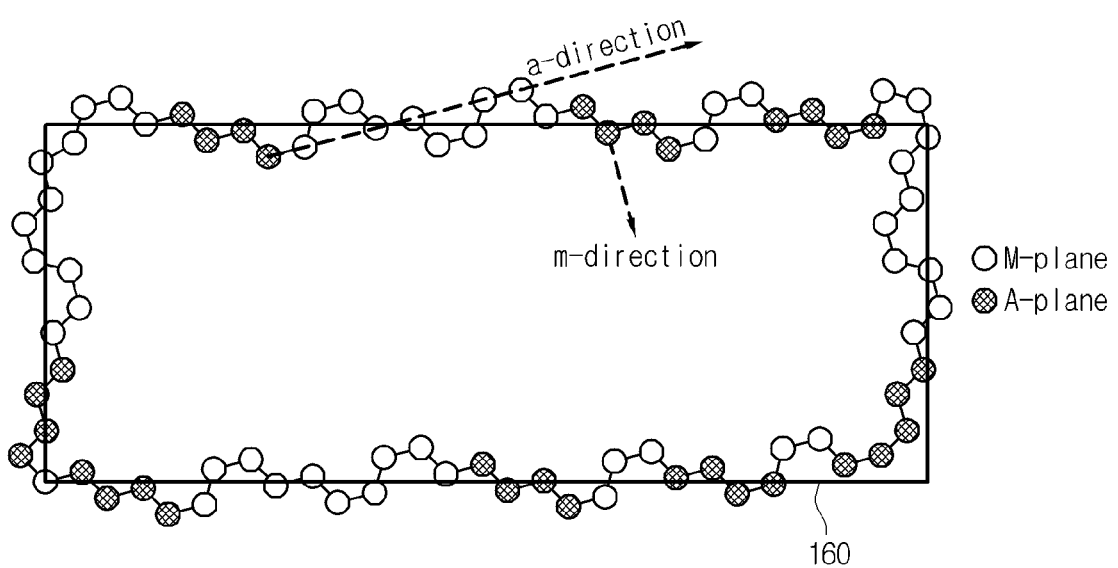
FIG. 9 is a view illustrating an atomic arrangement of a light emitting structure layer.

FIG. 9 is a view illustrating an atomic arrangement of a light emitting structure layer.

Referring to FIG. 9, the light emitting structure layer 160 may have four lateral surfaces. At least one lateral surface may have cleavage planes in which the A-plane perpendicular to an m-direction and the M-plane perpendicular to an a-direction are alternately formed.

When the cleavage planes of the A-plane and the M-plane are formed on the lateral surface of the light emitting structure layer 160, roughness of the lateral surface of the light emitting structure layer 160 increases. Also, when the roughness of the lateral surface of the light emitting structure layer 160 increases, light generated in the light emitting structure layer 160 may be easily extracted to the lateral surface to increase lateral light emitting efficiency of the light emitting device.

Figure 10:
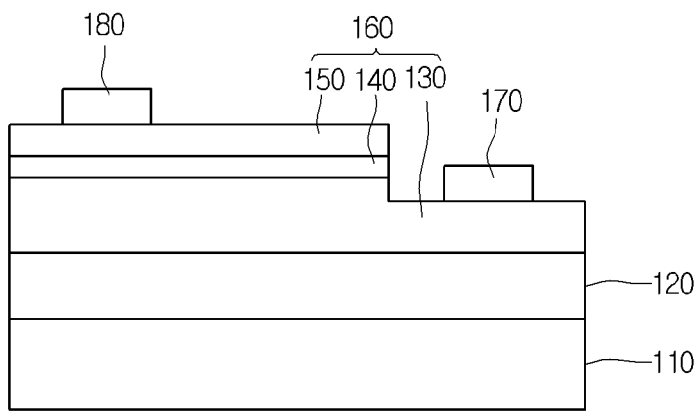
FIGS. 10 and 11 are sectional views of light emitting devices according to an embodiment.
Figure 11:
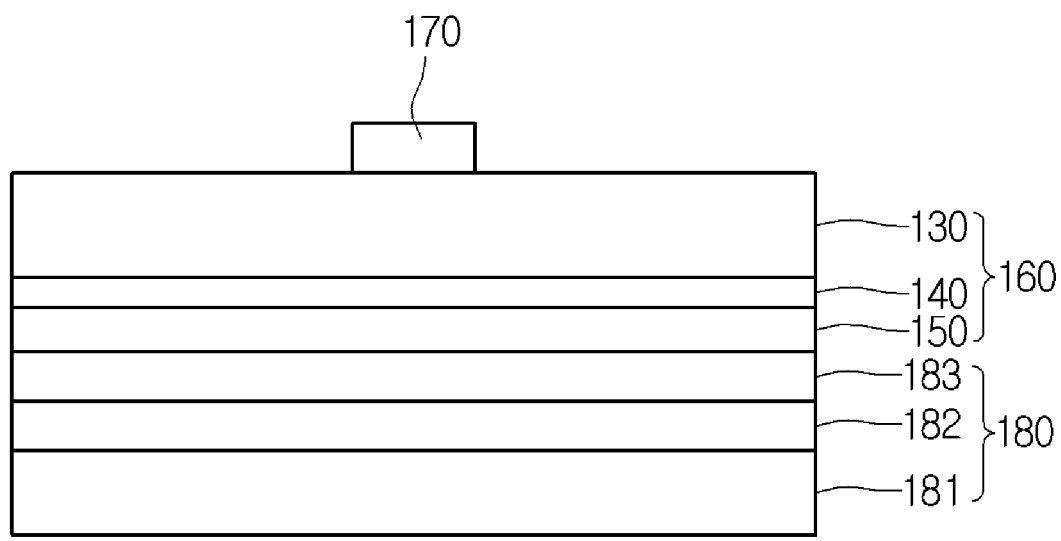

FIGS. 10 and 11 are sectional views of light emitting devices according to an embodiment.

Referring to FIG. 10, in a light emitting device, an undoped nitride semiconductor layer 120 is disposed on a sapphire substrate 110. A light emitting structure layer 160 including a first conductive type semiconductor layer 130, an active layer 140, and a second conductive type semiconductor layer 150 is disposed on the undoped nitride semiconductor layer 120. The light emitting structure layer 160 may be selectively removed. A first electrode layer 170 is disposed on the first conductive type semiconductor layer 130, and a second electrode layer 180 is disposed on the second conductive type semiconductor layer 150.

Referring to FIG. 11, in a light emitting device, a light emitting structure layer 160 is disposed on a second electrode layer 180, and a first electrode layer is disposed on the light emitting structure layer 160.

The second electrode layer 180 may include a conductive support substrate 181, a reflective layer 182 disposed on the conductive support substrate 181, and an ohmic contact layer 183 disposed on the reflective layer 182. Also, the light emitting structure layer 160 may include a second conductive type semiconductor layer 150 disposed on the ohmic contact layer 183, an active layer 140 disposed on the second conductive type semiconductor layer 150, and a first conductive type semiconductor layer 130 disposed on the active layer 140.

As shown in FIG. 9, at least one lateral surface of each of the light emitting structure layers 160 of FIGS. 10 and 11 may have cleavage planes having an A-plane and an M-plane.

Figure 12:
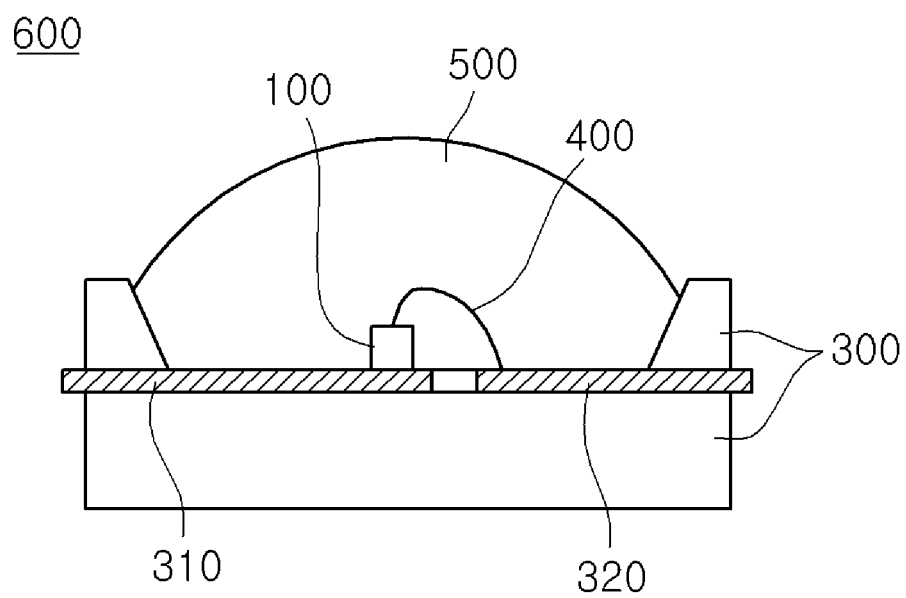
FIG. 12 is a sectional view of a light emitting device package including a light emitting device according to embodiments.

FIG. 12 is a sectional view of a light emitting device package including a light emitting device according to embodiments.

Referring to FIG. 12, a light emitting device package 600 according to an embodiment includes a package body 300, first and second electrodes 310 and 320 disposed on the package body 300, a light emitting device 100 disposed on the package body 300 and electrically connected to the first and second electrodes 310 and 320, and a molding member 500 surrounding the light emitting device 100.

The package body 300 may be formed of a silicon material, a synthetic resin material, or a metal material. An inclined surface may be disposed around the light emitting device 100.

The first and second electrodes 310 and 320 are electrically separated from each other to supply a power to the light emitting device 100. Also, the first and second electrodes 310 and 320 may reflect light generated in the light emitting device 100 to increase light efficiency. In addition, the first and second electrodes 310 and 320 may discharge heat generated in the light emitting device 100.

The light emitting device 100 may include a lateral-type light emitting device as shown in FIG. 10 or a vertical-type light emitting device as shown in FIG. 11. The light emitting device 100 may be disposed on the package body 300 or the first and second electrodes 310 and 320.

The light emitting device 100 may be electrically connected to the first electrode 310 and/or the second electrode 320 through a wire 400. Since the vertical-type light emitting device 100 is described as an example in the present embodiment, one wire 400 may be used. Alternatively, when the light emitting device 100 is the vertical-type light emitting device, two wires 400 may be used. When the light emitting device 100 is a flip-chip type light emitting device, the wire 400 may not be provided.

The molding member 500 may surround the light emitting device 100 to protect the light emitting device 100. Also, a phosphor may be contained in the molding member 500 to change a wavelength of the light emitted from the light emitting device 100.

The light emitting device package 600 according to an embodiment may have superior light efficiency because the light emitting device 100 having improved light extraction efficiency is applied to the light emitting device package 600.

A plurality of light emitting device packages 600 is arrayed on the substrate. Optical members such as a light guide plate, a prism sheet, a diffusion sheet, and a fluorescence sheet may be disposed on a path of the light emitted from the light emitting device package 600. The light emitting device package, the substrate, and the optical members may be functioned as a backlight unit or a light unit. For example, a lighting system may include the backlight unit, the lighting unit, an indicating device, a lamp, and a street lamp.

Figure 13:
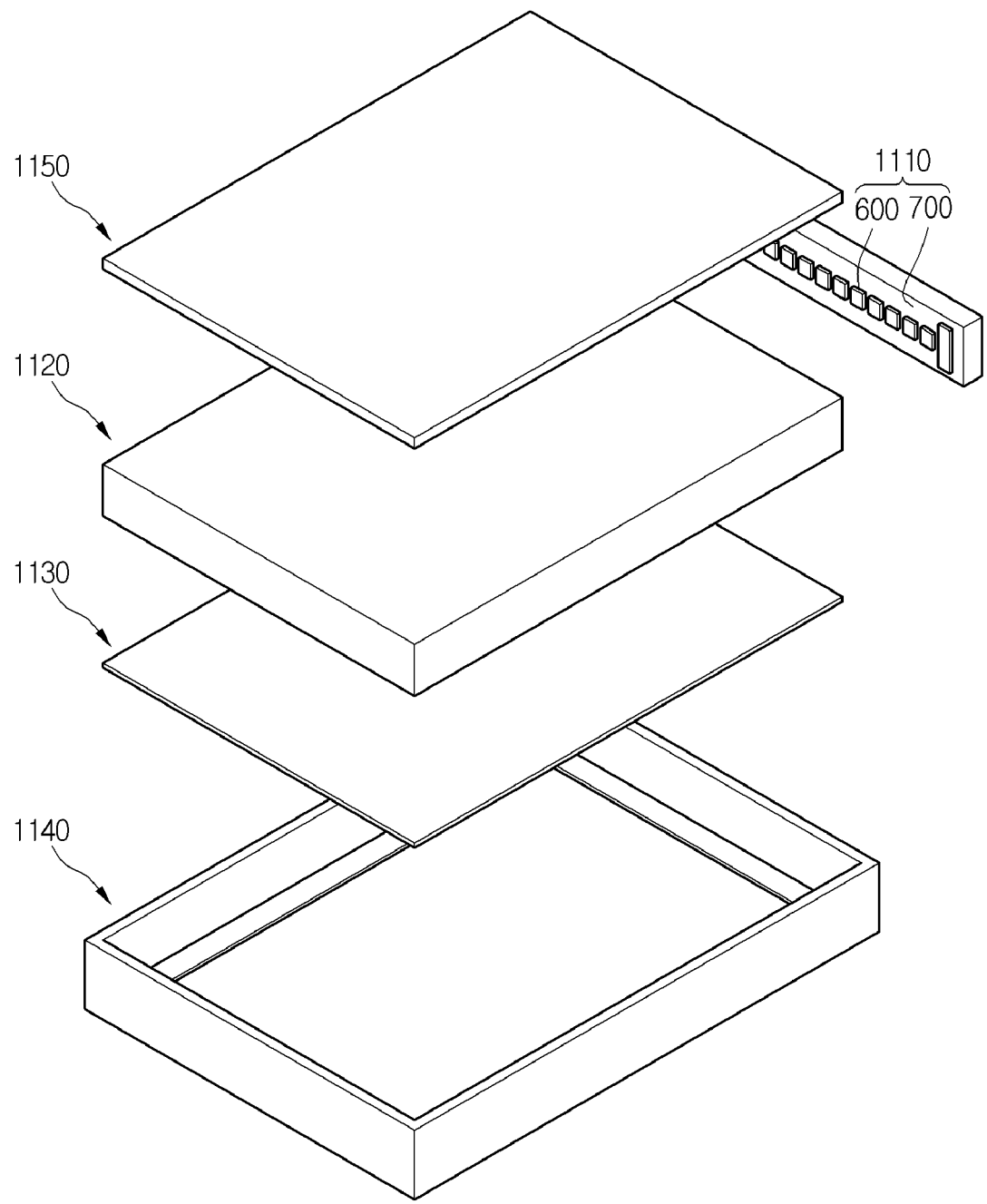
FIG. 13 is a perspective view of a backlight unit using a light emitting device or a light emitting device package according to an embodiment.

FIG. 13 is a perspective view of a backlight unit using a light emitting device or a light emitting device package according to an embodiment. However, the backlight unit 1100 of FIG. 13 is an example of the lighting system, the present disclosure is not limited thereto.

Referring to FIG. 13, the backlight unit 1100 may include a bottom frame 1140, a light guide member 1120 disposed within the bottom frame 1140, and a light emitting module 1110 disposed on at least one side or an under surface of the light guide member 1120. Also, a reflective sheet 1130 may be disposed under the light guide member 1120.

The bottom frame 1140 may have a box shape with an opened upper side to receive the light guide member 1120, the light emitting module 1110, and the reflective sheet 1130. The bottom frame 1140 may be formed of a metal material or a resin material, but is not limited thereto.

The light emitting module 1110 may include a substrate 700 and a plurality of light emitting device packages 600 mounted on the substrate 700. The plurality of light emitting device packages 600 may provide light to the light guide member 1120.

As shown in FIG. 13, the light emitting module 1110 may be disposed on any one of inner surfaces of the bottom frame 1140. Thus, the light emitting module 1110 may provide light toward at least lateral surface of the light guide member 1120.

The light emitting module 1110 may be disposed in the bottom frame 1140 to provide light toward an under surface of the light guide member 1120. This may be variously varied according to a design of the backlight unit 1100, but is not limited thereto.

The light guide member 1120 may be disposed within the bottom frame 1140. The light guide member 1120 may receive the light provided from the light emitting module 1110 to produce planar light, and then guide the planar light to a liquid crystal panel (not shown).

For example, the light guide member 1120 may be a light guide panel (LGP). The LGP may be formed of one of a resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed on the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet 1150. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. The fluorescence sheet may be a light transmitting plate or film including a phosphor.

The reflective sheet 1130 may be disposed under the light guide member 1120. The reflective sheet 1130 reflects the light emitted through the under surface of the light guide member 1120 toward a light emitting surface of the light guide member 1120.

The reflective sheet 1130 may be formed of a material having superior reflectance, e.g., a PET resin, a PC resin, or a PVC resin, but is not limited thereto.

Figure 14:
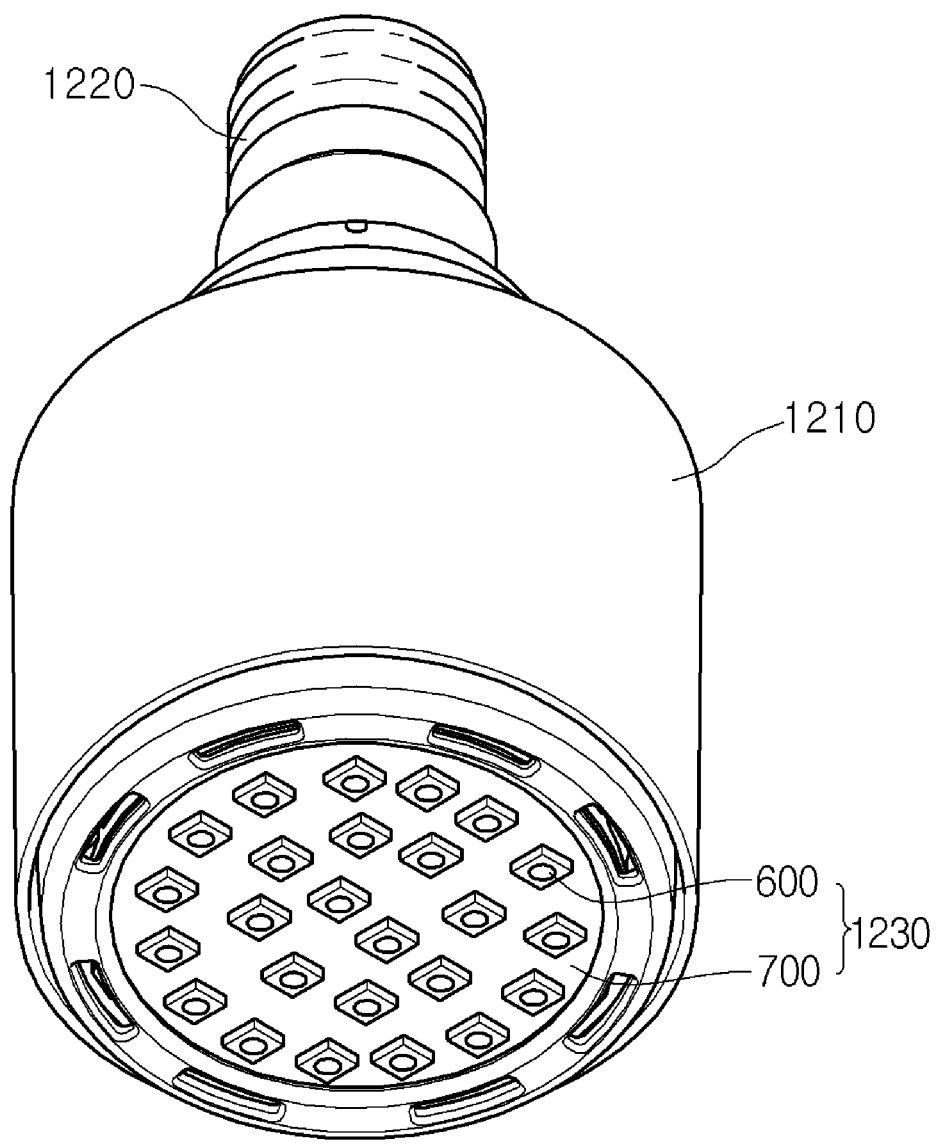
FIG. 14 is a perspective view of a lighting unit using a light emitting device or a light emitting device package according to embodiments.

FIG. 14 is a perspective view of a lighting unit using a light emitting device or a light emitting device package according to embodiments. However, the lighting unit 1200 of FIG. 14 is an example of the lighting system, the present disclosure is not limited thereto.

Referring to FIG. 14, the lighting unit 1200 may include a case body 1210, a light emitting module 1230 disposed on the case body 1210, a connection terminal 1220 disposed on the case body 1210 to receive a power from an external power source.

The case body 1210 may be formed of a material having good thermal dissipation properties, e.g., a metal material or a resin material.

The light emitting module 1230 may include a substrate 700 and at least one light emitting device package 600 mounted on the substrate 700.

A circuit pattern may be printed on a dielectric to form the substrate 700. For example, the substrate 700 may include a printed circuit board (PCB), a metal core PCB, a flexible PCB, and a ceramic PCB.

Also, the substrate 700 may be formed of an effectively reflective material or have a color on which light is effectively reflected from a surface thereof, e.g., a white color or a silver color.

At least one light emitting device package 600 may be mounted on the substrate 700. The light emitting device package 600 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of the LED to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet changes a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. Referring to FIG. 14, the connected terminal 1220 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

As described above, in the lighting system, at least one of the light guide member, the diffusion sheet, the light collection sheet, the brightness enhancement sheet, and the fluorescence sheet may be disposed on the path of the light emitted from the light emitting module to obtain a desired optical effect.

As described above, since the lighting system includes the light emitting device package according to an embodiment, the lighting system may emit light having high luminescent efficiency.

Any reference in this specification to "one embodiment," "an embodiment," example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising a light emitting structure layer including:
   a first conductive type semiconductor layer;
   an active layer on the first conductive type semiconductor layer; and
   a second conductive type semiconductor layer on the active layer,
   wherein all the sides of the first conductive type semiconductor layer and the second conductive type semiconductor layer of the light emitting structure layer alternately comprise cleaved facets of A-plane and M-plane.

2. The light emitting device according to the claim 1, wherein a C-plane sapphire substrate is disposed under the light emitting structure layer.

3. The light emitting device according to the claim 2, comprising a first electrode layer on the first conductive type semiconductor layer and a second electrode layer on the second conductive type semiconductor layer.

4. The light emitting device according to the claim 1, comprising a first electrode layer on the light emitting structure layer and a second electrode layer under the light emitting structure layer.

5. The light emitting device according to the claim 1, wherein the light emitting structure layer is a III-V group nitride compound semiconductor layer.

6. The light emitting device according to the claim 1, wherein the light emitting structure layer is a GaN-based semiconductor layer.

7. A light emitting device package comprising:

a package body;

a first electrode and a second electrode electrically separated from each other on the package body;

a light emitting device electrically connected with the first electrode and the second electrode on the package body; and a molding member surrounding the light emitting device on the package body, wherein the light emitting device comprises a light emitting structure layer having a first conductive type semiconductor layer, an active layer on the first conductive type semiconductor layer, and a second conductive type semiconductor layer on the active layer, and wherein all the sides of the first conductive type semiconductor layer and the second conductive type semiconductor layer of the light emitting structure layer alternately comprise cleaved facets of A-plane and M-plane.

* * * * *